United States Patent [19]

Avedissian et al.

[11] Patent Number: 4,472,218
[45] Date of Patent: Sep. 18, 1984

[54] REMOVING ARTICLES FROM AN ADHESIVE WEB

[75] Inventors: Michael K. Avedissian, Mohnton; Donald M. Large, Temple; Anthony J. Schorr, Birdsboro; Joseph A. Tamashasky, New Philadelphia, all of Pa.

[73] Assignee: AT&T Technologies, Inc., New York, N.Y.

[21] Appl. No.: 564,959

[22] Filed: Dec. 23, 1983

[51] Int. Cl.³ .......................................... B32B 31/16
[52] U.S. Cl. ..................... 156/64; 29/426.3; 29/426.5; 29/574; 156/344; 156/378; 156/510; 156/569; 156/584
[58] Field of Search ............... 29/426.1, 426.3, 426.5, 29/574; 156/344, 584, 510, 569, 64, 378

[56] References Cited

U.S. PATENT DOCUMENTS

| | | | |
|---|---|---|---|
| 3,720,309 | 3/1973 | Weir | 209/73 |
| 3,785,507 | 1/1974 | Wiesler et al. | 214/1 BH |
| 3,915,784 | 10/1975 | Makhijani et al. | 156/344 |
| 3,988,822 | 11/1976 | Lopez et al. | 29/426.5 |
| 4,253,906 | 3/1981 | Boogers | 156/344 X |
| 4,312,695 | 1/1982 | Willis | 156/344 |
| 4,334,945 | 6/1982 | Raush | 156/344 |
| 4,388,399 | 6/1983 | Shinozaki et al. | 430/271 |

*Primary Examiner*—Robert A. Dawson
*Attorney, Agent, or Firm*—D. C. Watson

[57] ABSTRACT

Articles such as miniature laser chips (15) are individually removed from an array on an adhesive web (20). A subjacent forming die has a planar, central surface (160) containing a vacuum cavity (120) and peripheral sloping surfaces (162). The web (20) has an adhesive side for holding the chips (15) and a smooth side for conforming to surfaces (160) and (162) of die (116). A leading target chip (15) is located centrally of cavity (120) on a planar portion of web (20) which portion is substantially restrained from movement away from die (116) by vacuum drawn in cavity (120). At the smooth side of web (20), within cavity (120), there is a needle (135) which is movable perpendicularly of and through web (20) along a path containing the target chip (15). At the adhesive side of web (20), opposite needle (135), there is a pickup probe (147) having a vacuum port (166) to retain a chip (15). Also, probe (147) is movable relative to and with a target chip (15) and the needle (135). Conveniently, probe (147) is registered with and forces a chip (15) into web (20) to reflect light and confirm contact. Then subjacent needle (135) is advanced to contact the same chip (15) from the smooth side of web (20). In synchronization, the probe (147) and needle (135) are then moved, with the chip (15) held therebetween, at least until the chip (15) is separated from web (20).

13 Claims, 16 Drawing Figures

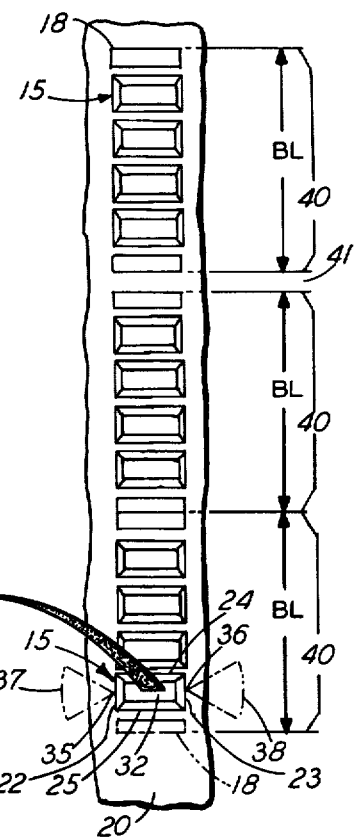
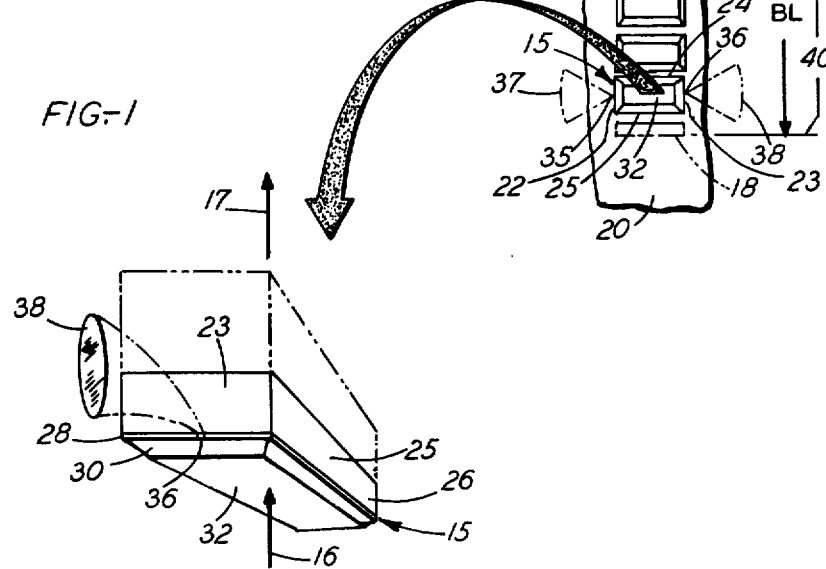

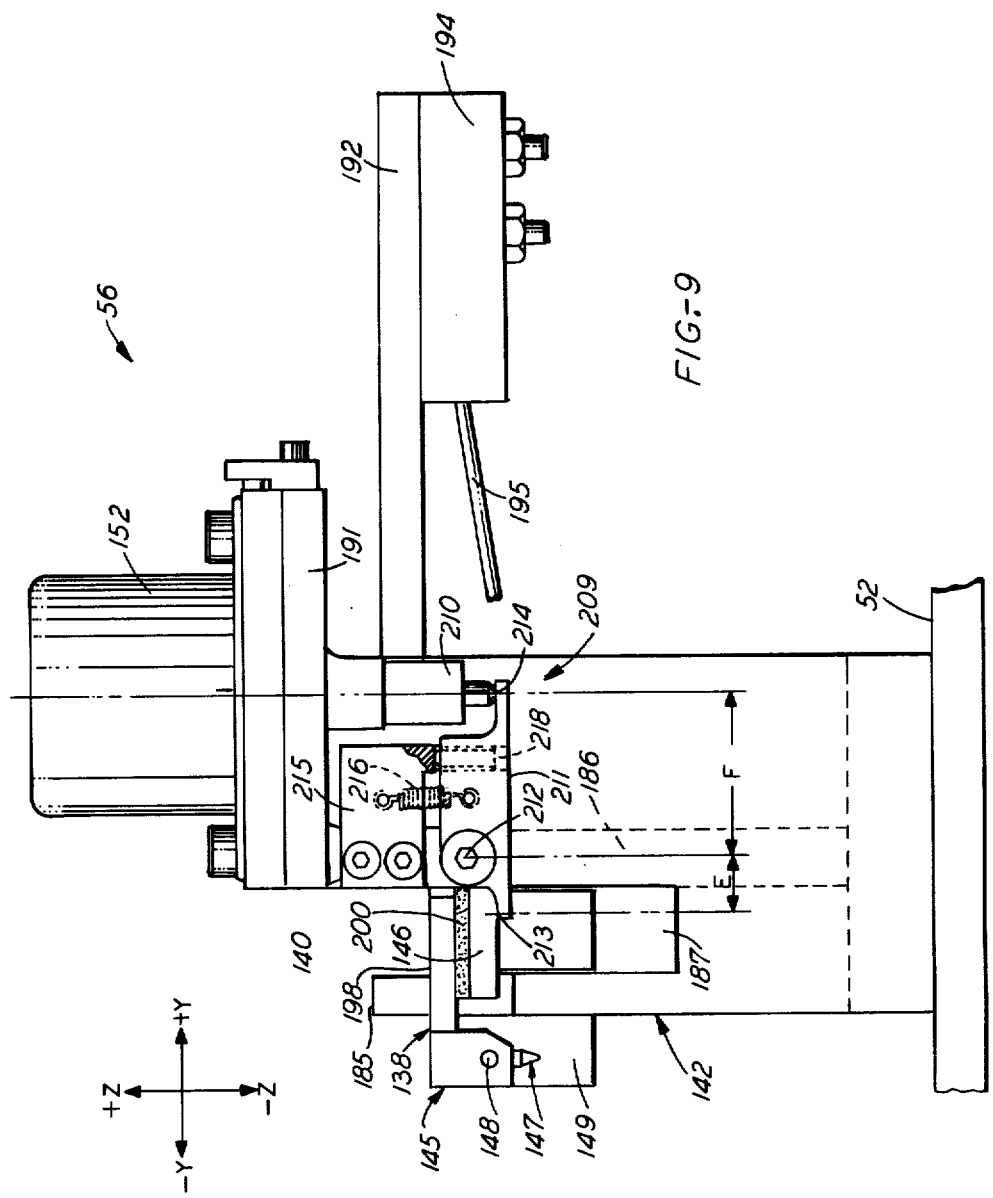

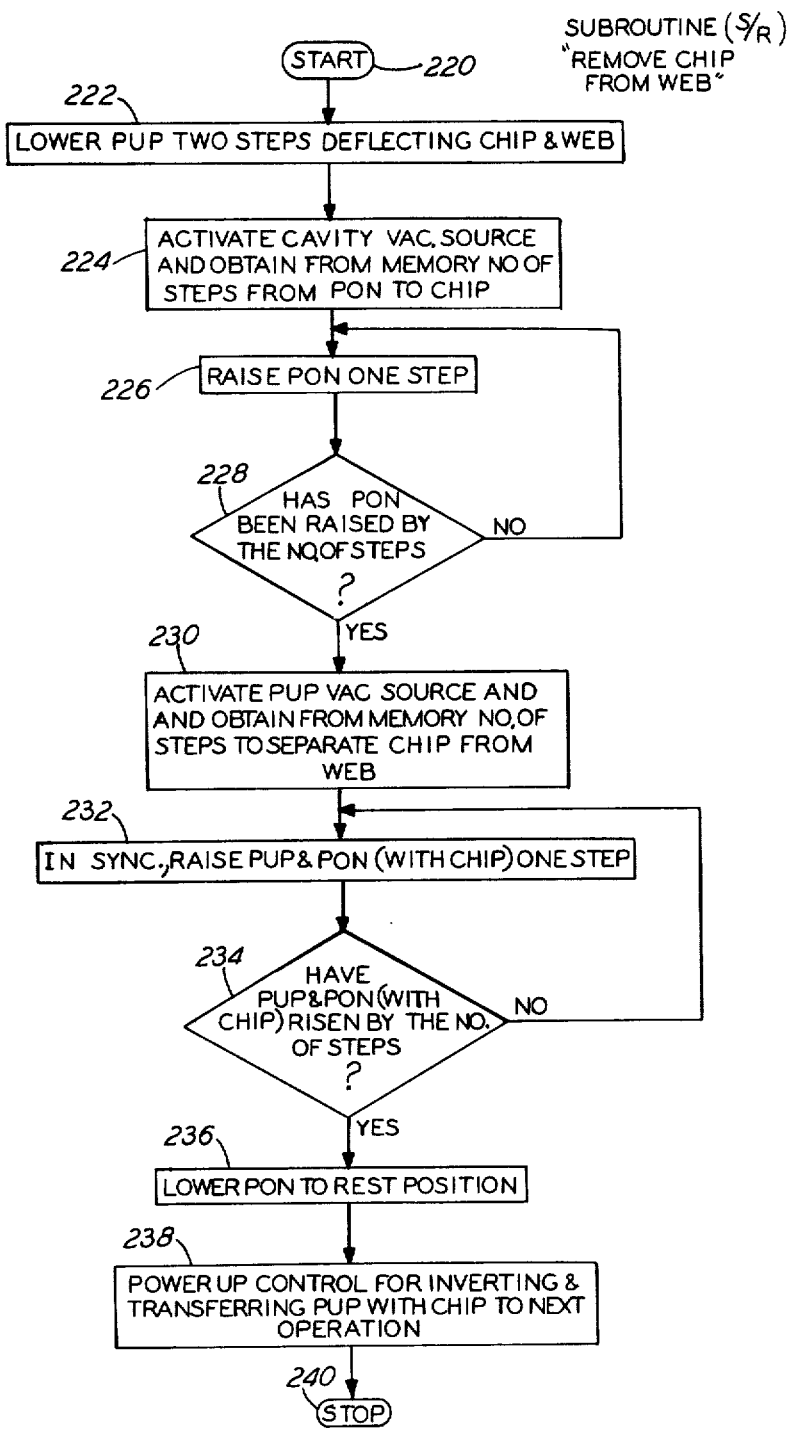

REMOVING ARTICLES FROM AN ADHESIVE WEB

TECHNICAL FIELD

This invention relates to removing articles from an adhesive web. More particularly, this invention relates to removing individual ones from an array of semiconductor chips adhered to a web for ease of handling.

BACKGOUND OF THE INVENTION

Miniature articles are difficult to handle during manufacturing operations, especially if such articles are light in weight. The problem is exemplified in the electronics industry by flat and rectangular, (typically square), semiconductor chips. Such chips have ranged from about 1 mm to about 10 mm square and from about 0.4 mm to about 0.8 mm in thickness. The problem has been intensified by the introduction of laser chips which may be less than 0.25 mm along a side and less than about 0.1 mm in thickness. Such laser chips are brittle and have a fragile construction; they are also so elusive that one may lose them through rough threads between a glass container and its metal cap.

An array of chips is typically formed from a semiconductor wafer and a known technique for processing the chips is to first mount the wafer to a sticky sheet, hereinafter referred to as an adhesive web. While still integral with the wafer, the chips are treated and often tested, and remain adhered to the web after separation. Semiconductor chips typically take on an individual identity during testing whereby it becomes desirable to sort and remove them on an individual basis. Laser chips are individually removed for separate testing and direct mounting in a service package. A problem is to remove a chip from an array without changing the exact positions of remaining chips. The positions of some chips are often carefully catalogued, for example in a computer memory, during testing. Another problem is to remove a target chip without damaging it or adjacent chips. A further problem is to remove a chip while maintaining or establishing a desired orientation such as to suit a next operation.

These and other problems are undertaken by disposing over a target chip, a pickup probe aligned with a push-off needle located under the chip and the web. The head and the needle move relative to, but not with, each other. The needle pushes against and often pierces the web and moves the chip into vacuum engagement with the head positioned above the chip. A problem is that most arrays of chips are spaced apart on a web by only the width of a saw blade or similar tool used for separating chips from wafers. Consequently, chips adjacent to a target chip are often disturbed or damaged by movement of the target chip, by movement of the web, or by contact with the pickup probe or the needle.

One solution to avoiding adjacent chips is to deform the web so a target chip is upwardly and singularly disposed on a plateau above the general plane of the web and over a push-off needle. Then the needle pierces the web and pushes the chip overhead to a spaced, vacuum probe, sometimes having a flat surface to receive the chip. A problem is that pierced web edges tend to cling to and travel with a push-off needle for an unacceptable upward distance. Adjacent chips are often disturbed and web damage interferes with indexing to a next target chip. Because a target chip is lifted precariously through space, the receiving surface of the probe is made large to block and prevent a chip from overturning. Orientation of a chip is often lost and fragile chips are sometimes damaged.

In solution of these problems, the pickup probe is sometimes revised to include a four-way pitched and inverted, vacuum cavity to closely engage a chip before it is pushed off. Also, to minimize web deformation, an annular guide surrounds the head to hold the web and adjacent chips downward during pickup. A blunt needle is used to push upwardly against or through the web to force the target chip into the cavity of the probe and the needle is then withdrawn. The head and the needle move relative to, but not with, each other. Such improved probe and guide assembly solve many former problems but are not amenable to smaller and more fragile articles such as laser chips.

For example, in operation and testing of a laser chip, there are emitted from two opposing ends, beams of light which would be obscured by edges of a pickup probe cavity. Therefore, such a chip cannot be light tested in the same probe utilized for removing the chip from an adhesive web. Also, the unusual thinness and brittleness of a laser chip militates against point pressure of a push-off needle while the chip is edge supported in a cavity. Even if a flat probe is used, as in the earlier art, a laser chip is too light in weight to be pushed through space to the probe without losing orientation or overturning. Also, the spacing of laser chips in an array (caused by their small width) is so close that typical upward movement of pierced web edges would disturb adjacent chips.

Accordingly, it is desirable to provide new and improved expedients to remove from adhesive webs, articles such as miniature semiconductor chips, and in particular very thin and fragile laser chips. Such chips should be removed with and tested on the same probe with a suitable orientation. Also, an acceptable integrity of web and remaining articles should be maintained for indexing and removal of successive target articles.

SUMMARY OF THE INVENTION

Expedients are provided for removing ones from an array of articles on an adhesive web including a subjacent die for forming the web into a preferred shape for pickup of a target article. The forming die has a planar, central surface containing a vacuum cavity and peripheral surfaces sloping away from the central surface. A web has an adherent side for holding the articles and a smooth side for contacting the die to conform the web to the die surfaces. The web holding the articles is conformed to the die surfaces so an article targeted for removal is located centrally of the cavity. A portion of the web over the central surface is substantially restrained from movement by expected forces away from the die by sufficient vacuum drawn in the cavity. A needle-like member is disposed within the cavity under the web. An assembly is provided which moves the needle longitudinally of itself and perpendicularly of and through the web along a path containing the target article. There is disposed at the adherent side of the web opposite the needle, a pickup probe including a system for retaining an article on the probe and an assembly which moves the head relative to and with the target article and the needle. Control mechanisms are provided to synchronize movement of the needle and the probe with the target article held therebetween at least until such article separates from the web.

BRIEF DESCRIPTION OF THE DRAWING

The invention will be more readily understood from the following detailed description when read in conjunction with the drawing wherein:

FIG. 1 is a pictorial view of a laser chip which may be removed from an adhesive web in accordance with the invention;

FIG. 2 is a greatly enlarged view of a partial row of laser chips mounted to an adhesive web;

FIG. 9 is a side view of the pickup assembly shown in FIG. 7, taken along line 9—9;

FIG. 10 is a flow chart of a subroutine by which a microprocessor controls critical chip removal steps in the practice of the invention.

Figure 3:
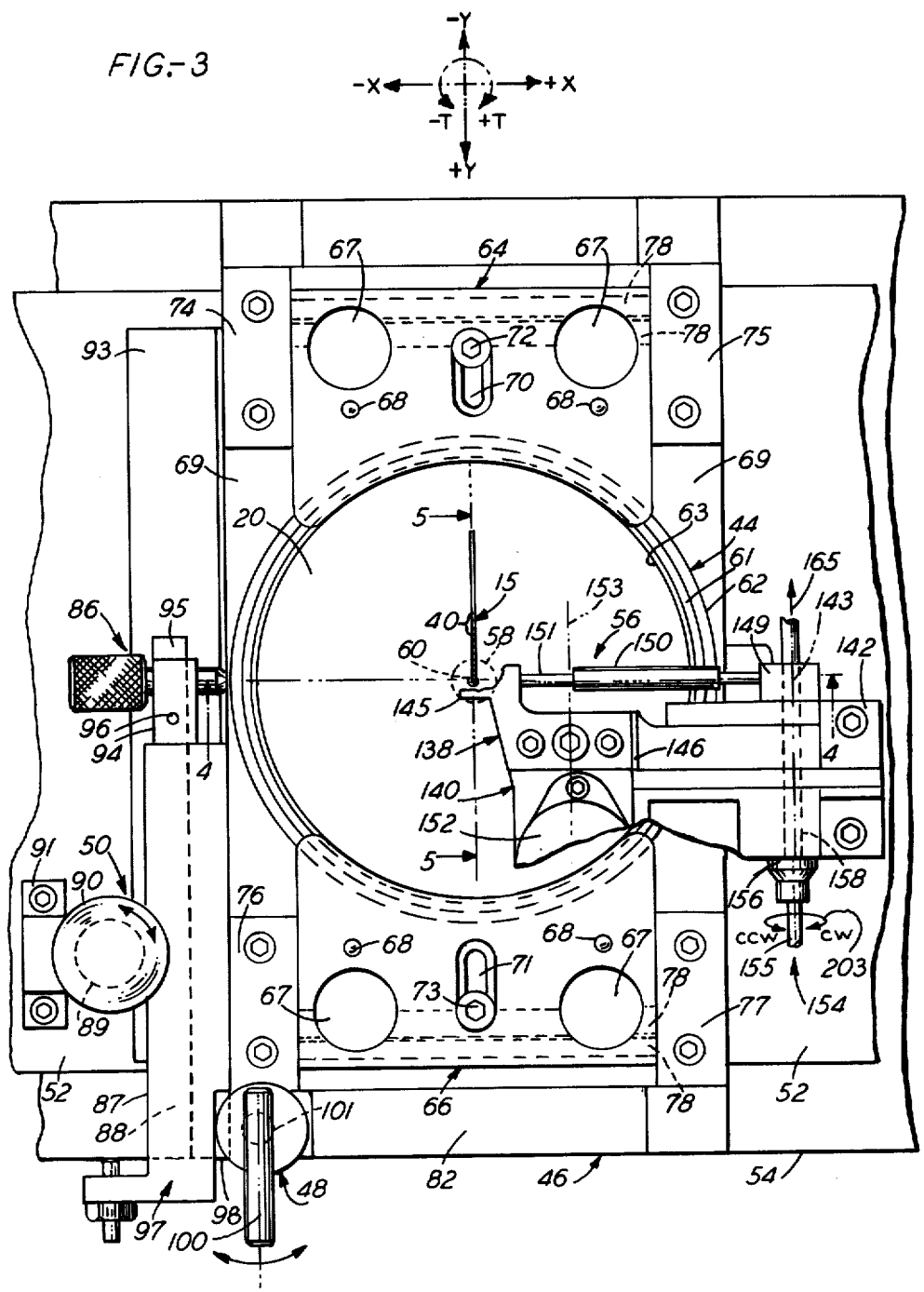
FIG. 3 is a plan view of apparatus including a hoop assembly (containing an adhesive web holding a row of laser chips) and a pickup assembly for practicing the instant invention.

Some of the elements in the figures are abbreviated or simplified to highlight features of the invention. Also, where appropriate, reference numerals have been repeated in the figures to designate the same or corresponding features in the drawing.

DETAILED DESCRIPTION

The Articles

FIG. 1 illustrates a typical article 15 which may be removed from an adhesive web in the practice of the invention. Such an article will be described herein primarily with respect to semiconductor chips and, more particularly with respect to laser chips, also designated generally as chips 15.

FIG. 1 shows a singular chip 15 in an operating orientation and mode under a bias condition causing current to flow as depicted by arrows 16 and 17. FIG. 2 shows a row of chips 15 (and scrap pieces 18) adhered to a web 20 in a processing mode and orientation wherein the chips 15 are inverted from the orientation shown in FIG. 1. FIGS. 1 and 2 will be referred to concurrently in describing a chip 15.

A chip 15 typically has short ends 22 and 23 having widths of about eight mils (0.20 mm), long sides 24 and 25 having lengths of about fifteen mils (0.38 mm) and a finished thickness of about four mils (0.10 mm). During processing, and while chips 15 are integral with a wafer, the thickness is about ten mils (0.25 mm) as depicted by phantom lines in FIG. 1. While still in a wafer, a substrate portion 26 may receive four epitaxial layers which are collectively shown and referred to as a double heterostructure 28 (DH 28). DH 28 is typically only about 0.002 mm thick and includes an active layer (not delineated) for producing light. Dimensions of chip 15 are given in machine shop units (and related to metric units) because apparatus discussed later is described relative to machine shop practice.

Adjacent the DH 28, a bonding pad 30 is provided having a broad surface forming a major side 32 for a finished chip 15. Because of the inverted manner utilized to process the chips 15, the major side 32 often appears to be a topside of chip 15 and may be referred to hereinafter as a topside 32. The other major side of chip 15 will be designated by the numeral 34 and is found along the exposed surface of substrate 26 which is not shown in FIG. 1 or 2. Such side 34 is adhered to web 20 and appears on the bottom of chip 15 during removal so it may often be referred to as a bottom side 34 or merely the bottom 34 of chip 15.

Current passing into DH 28 is confined by treatment of lateral portions to a channel which extends lengthwise of chip 15 and exits at windows 35 and 36. Under proper bias, two light beams 37 and 38 are emitted from windows 35 and 36, respectively, from very near the edge of ends 22 and 23. Accordingly, a chip 15 is typically mounted on a pedestal (not shown) preferably with ends 22 and 23 slightly overhanging to avoid obscuring portions of light beams 37 and 38. Unlike conventional chips, the condition of the ends 22 and 23, and the respective windows 35 and 36, are very important to the chip 15, the formation of such items receives much consideration and there may be no mechanical contact to the windows.

Windows 35 and 36 are preferably formed in a surface of a predetermined crystalline plane and such surface is preferably obtained by breaking rather than by otherwise cutting along such plane in a wafer. In a typical example, bars 40 having a length BL of about 1.27 mm (50 mils) may be separated from a wafer by breaking over a straight edge. Bars 40 may be disposed in a row in a fixture (not shown) where the portions forming ends 22 and 23 are treated and the row of bars are adhered to a web 20. Then the chips 15 are separated by sawing the row of bars 40 on web 20 to obtain the array seen in FIG. 2. A risk of damage to ends of such fragile bars 40 requires that pieces 18 be scrapped. Also, a gap 41 sometimes occurs because the lightweight bars 40 are not readily slidably arranged end-to-end in the treatment fixture.

It will be appreciated that breaking bars 40 from wafers to obtain crystal surfaces is facilitated by having thin wafers. Consequently, the wafer portion which becomes substrate 26 is greatly thinned as seen in FIG. 1. Unfortunately, such thinness causes substantial loss of mass and vexatious handling problems not normally seen in handling conventional chips.

The loss of mass also adds to fragility inherent in solid state materials used for laser chips. Most such materials are selected from compounds formed of III-V elements found in the Periodic Table. Initially such materials included GaAs and AlGaAs with various dopants although now there is also included InP, InGaAs, InGaAsP and many variants. Crystalline chips formed from most such compounds are brittle and resist little flexural stresses compared to conventional semiconductor chips. Also a light producing layer in a DH 28 may be only about 0.2 micron thick and be very sensitive to unsupported, point contact pressure experienced in conventional handling.

Unlike most semiconductor chips, the chips 15 are not fully tested while still integral with a wafer. For example, the functional ends 22 and 23 cannot be tested for light output until separation occurs. Consequently, each chip 15 is presumed capable of as much light as another in a wafer and all should be tested after removal from web 20 and prior to assembly in a device package.

In further contrast to conventional chips, the laser chips 15 are so difficult to handle even for testing, that early efforts at automation, or at least mechanical handling, have been initiated. However, it was considered desirable to test each chip 15 in the same head used to remove the chip from a web 20. Unfortunately, the heads used for conventional, successful removal of chips from an adhesive web are not suitable for testing laser chips 15.

Such conventional heads are typically designed to handle square chips of a conventional thickness, material and strength. A head has an inverted, four-way pitched vacuum cavity such as would be neatly disposed over a small pyramid. The head is downwardly contacted to adjacent chips, and a target chip is upwardly pushed into vacuum engagement in the cavity by a subjacent needle. A problem is that the head is typically unyielding to the pressure of the needle against the chip and the walls of the cavity. Also, the chip is edge supported in the cavity. Consequently, the chip receives point pressure at about its central region which is not back supported. Also, by being edge supported, the chip receives, under vacuum forces, flexural stresses which are high and are exacerbated by the point contact pressure of the push-off needle. Further, a laser chip 15 could not be reliably tested because the light beams 37 and 38 would be obscured in a cavity, particularly if the windows 35 and 36 are near a topside 32 as occurs on web 20. Accordingly, new and improved expedients are needed to remove such articles 15 from the web 20.

Although the above discussion has dwelled primarily upon chip 15 as an article to be removed from an adhesive web, it is to be understood that the invention is not so limited. It is apparent that many of the problems in handling a laser chip 15 are similar to, although often more difficult than, the problems in handling conventional semiconductor chips which may also be removed by the invention. Also, the article 15 need not be a semiconductor chip, but may as well be any article of analogous configuration adhered to an adhesive web and requiring removal.

The Web And Removal Apparatus

Figure 4:
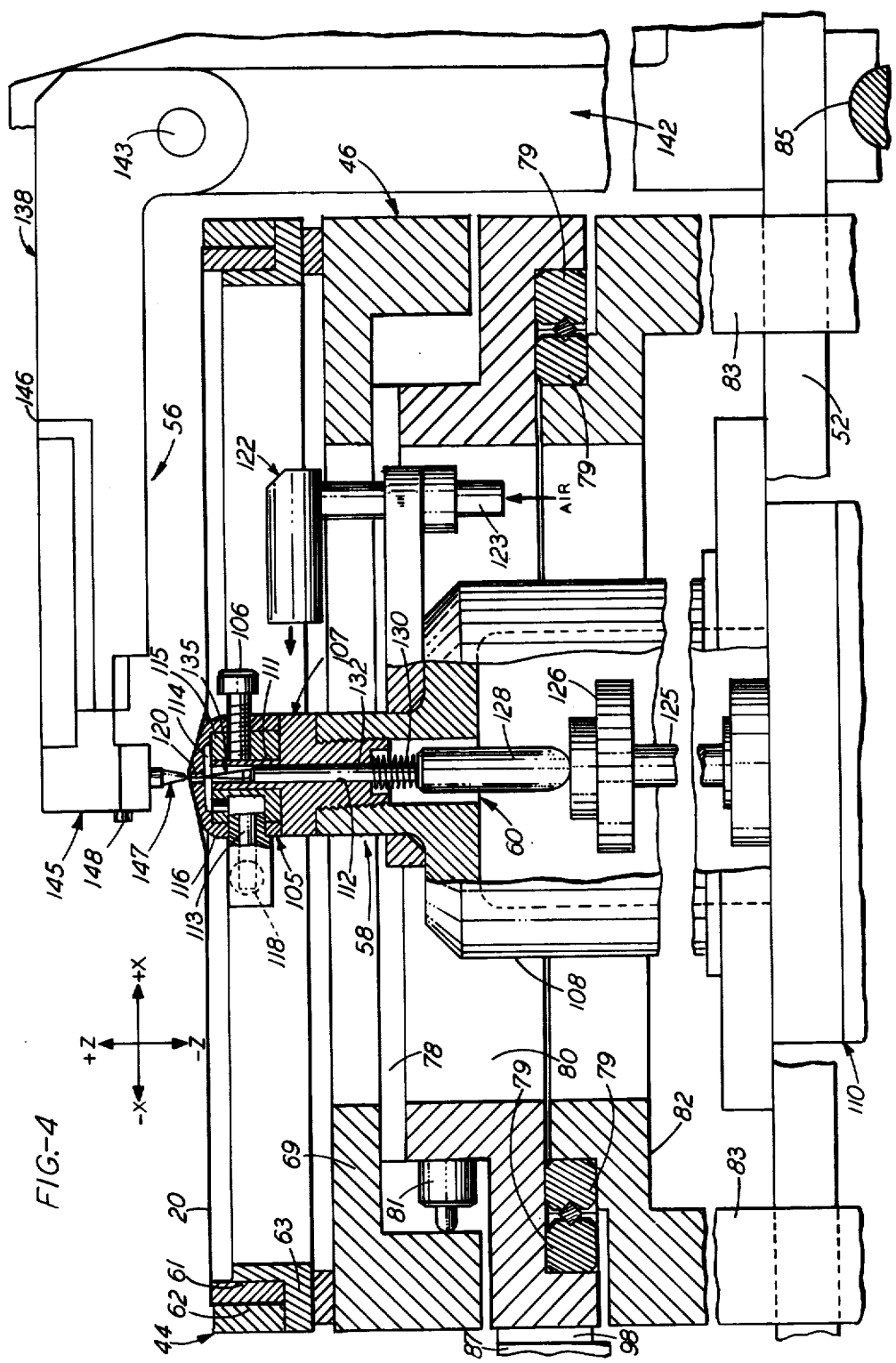
FIG. 4 is a view of the apparatus shown in FIG. 3, taken along line 4—4, wherein the hoop assembly is shown predominantly in section and the pickup assembly is shown in elevation.

FIGS. 3 and 4 illustrate a convenient web 20, chips 15 and apparatus for removing the chips from the web 20. FIG. 3 is a plan view, and FIG. 4 is an enlarged sectional view of most of the apparatus with some portions shown in elevation.

The apparatus includes a hoop 44, a hoop holder 46, holder indexers 48 and 50, a movable plate 52, a movable base 54, an overhead pickup assembly 56, a subjacent die assembly 58, a needle assembly 60 and ancillary features. For example, the hoop 44 includes an inner ring 61 and an outer ring 62 for supporting a web 20 on a ring 63 (having an angular section) on the holder 46.

The web 20 is preferably a pressure sensitive sheet having an adhesive material on a first side, seen as a topside in FIGS. 3 and 4, and a second side which is preferably smooth. A suitable sheet having further desirable properties is discussed later with respect to problems incurred in a chip removal process. Such a web 20 is tightly stretched over, and annual portions are secured between, the inner ring 61 and the outer ring 62 to form the hoop 46 in a manner similar to that used for doing needlework on a cloth.

Hoop 44 may be about four inches (101.6 mm) in diameter and a row of bars 40 may be about two and one-half inches (63.5 mm) in length and be held on web 20 to provide about 200 laser chips 15 for pickup. Hoop 44 is preferably, removably secured in the holder 46 by arcuately formed plates 64 and 66. Such plates 64 and 66 have finger recesses 67 for manual manipulation and spring plungers 68 to bias the plates upwardly from the top of a support frame 69. The plates 64 and 66 also have slots 70 and 71, respectively, to accommodate shoulder screws 72 and 73 which pull the plates downward, locking hoop 44 in place upon the top of frame 69. Adjacent to the hoop plates 64 and 66 and fastened to the top of frame 69, there are guiding members 74-77 to restrain plates 64 and 66 in a lateral direction.

To install a hoop 44 on frame 69, one loosens screws 72 and 73 which permits spring plungers 68 to bias the arcuate edge portions of plates 64 and 66 upwardly away from frame 69. Plate 64 is moved to the rear, plate 66 is moved forward and a hoop 44 is placed around and upon the angular ring 63 and oriented with respect to pickup apparatus. To achieve such orientation, holder 46 is moved back and forth, and the hoop 44 is turned until all chips 15 in a row seem to follow the subjecent needle assembly 60 or its features. Plates 64 and 66 are then moved into place over rings 61 and 62, compressed downward and secured by screws 72 and 73, respectively, to frame 69.

FIG. 4 shows the shape assumed by web 20 when hoop 44 is forced downward upon frame 69. Such shape is of value to the pickup procedure of the invention. Moreover, web 20 assumes a similar shape under a different chip 15 as hoop 44 and holder 46 are indexed by apparatus which will now be described.

Holder 46 includes four pairs of linear slides 78 and 79 arranged to index in mutually perpendicular $\pm X$ and $\pm Y$ directions, respectively, as indicated by the arrows at the top of FIG. 3. A polar arrow denoted $\pm T$ for theta is included for discussing orientation of hoop 44. A pair of X slides 78 are indicated by dotted lines at each end of holder 46 in FIG. 3 to show how frame 69 may slide relative to an intermediate frame 80 (FIG. 4). Frame 69 is biased with respect to frame 80 by three spring plungers 81 (only one shown). Intermediate frame 80 may slide relative to a fixed frame 82 by a pair of Y slides 79 shown in FIG. 4. Support of fixed frame 82 is achieved by six posts 83 located about the perimeter of such frame (portions of two such posts are seen in FIG. 4). Posts 83 are supported from a base member 54 (FIG. 3) which is movable in the X direction.

Between base 54 and the underside of fixed frame 82 there is a movable plate 52 which extends under and on two sides of holder 46 and is fitted around the posts 83. Plate 52 is supported from, and is movable in the Y direction, along two rails 85 which bear upon base 54 (only one seen in FIG. 4). Plate 52 supports the pickup assembly 56 on the $+X$ side of holder 46, the die assembly 58 under the holder 46 (FIG. 4) and portions of a Y direction indexer 50 and an X direction limiter 86 on the $-X$ side of holder 46.

Both base 54 and plate 52 are movable for reasons which are unimportant to the description of this case. The movement of holder 46 with respect to pickup assembly 56 and die assembly 60 is of importance and will now be explained.

FIG. 3 shows that the chips 15 are, but would not have to be, aligned in a row extending in the Y direction. As explained above, a theta adjustment is manually made so the row of chips seems to follow the needle assembly 60 under web 20 when such web is indexed in a ±Y direction. The chips 15 are only about 15 mils (0.38 mm) long in the X direction, but the row is about 2.5 inches (63.5 mm) long in the Y direction. Consequently, there is minimal indexing required for adjustment in the X direction but extensive indexing required in the Y direction to pick up successive chips 15.

The Y indexer 50 (FIG. 3) includes a block 87 affixed to the side of intermediate frame 80 (FIG. 4), and block 87 has affixed along its bottom a rack 88. Rack 88 has a row of laterally disposed teeth engaged to a pinion 89 which is turned by a wheel 90 and is supported by a bracket 91 from plate 52. Between the bottom of rack 88 and the surface of plate 52, a hard plate 93 is provided for friction purposes. Affixed to the −Y end of block 87, there is a small block 94 having a member 95 of yielding material such as a plastic attached thereto. Member 95 has a vertical portion for attachment purposes and an underlying portion which is biased against friction plate 93 by an adjustable spring plunger 96. At the +Y end of block 87 a stop assembly 97 is provided to engage pinion block 91 and limit the −Y travel of holder 46.

FIG. 4 shows that frame 69 is normally biased in the −X direction by spring plungers 81. In opposition to such bias, a limiter screw 86 (FIG. 3) is provided which is adjusted initially to keep frame 69 aligned to frame 80 (FIG. 4). An X indexer 48 is mounted to frame 69 and includes components to push against frame 80 via a vertical wear plate 98 (attached to block 87) to compress spring plungers 81 and move holder 46 in the +X direction. Also, such components may relax pressure against wear plate 98 to relieve stress in spring plungers 81 and move holder 46 in the −X direction. The components of X indexer 48 include a handle 100 which turns a pin 101 connected eccentrically to a horizontally disposed disc (not shown) which engages wear plate 98.

As best seen in FIG. 4, the die assembly 58 and the needle assembly 60 are located under web 20 and are supported upon plate 52. Die assembly 58 includes a head 105 attached by a set screw 106 to a bushing 107 which is threaded into a housing 108 of a linear stepping motor 110. Bushing 107 has a tubular end 111, and a bore 112 extends completely through bushing 107 and its end 111 to a chamber 114 in head 105. Surrounding tubular end 111 there is an annular block 115 which supports a die 116 having specially shaped surfaces, to be discussed later with respect to enlarged views in FIGS. 5A-G. Die 116 and block 115 are penetrated by a vacuum passageway 113 extending into the chamber 114. Passageway 113 connects to a rear fitting 118 which is served by a vacuum source (not shown). Die 116 also includes a centrally located, needle cavity 120 which will also be described in more detail with respect to FIGS. 5A-G.

It has been found that heat can build up under web 20 from motors and nearby heat-generating apparatus. Such heat tends to be retained by die 116 and causes web 20 to adhere to the die surfaces to frustrate proper indexing of web 20 over die 116. Consequently, an air nozzle 122 is provided to direct air onto die assembly 58 from a source (not shown) connected to a fitting 123 to dissipate heat.

Motor 110 is preferably a linear stepping motor which translates its shaft 125 in successive steps, in response to successive 12 volt digital pulses. Such a motor is provided by North American Phillips Controls Corporation of Cheshire, Conn., and sold under its trade designation as a "Digital Linear Actuator, K-92211-P2." Motor 110 causes shaft 115 to advance or retract about 1 mil (0.0254 mm) per pulse over a maximum distance of about 0.875 inch (22.2 mm).

Shaft 125 is fitted with a configured cap 126 which engages and drives the needle assembly 60 which includes a lower pin 128 having a rounded end. Pin 128 is biased downwardly by a spring 130 seated in bushing 107. Pressed into pin 128 there is a thin rod 132 having a counterbore to receive a needle 135 which may be replaceable. Needle 135 will be described further in discussing a chip removal process.

Overhead of web 20, there is the pickup assembly 56 which has a movable portion 138 and a fixed portion 140 (FIG. 3), both supported by a stand 142 from the plate 52. Assembly 56 is further described by referring to mutually perpendicular directional arrows X and Z in FIG. 4. Although a pickup head 145 (FIG. 4) is hereafter assumed to move upwardly in a +Z direction, such head will actually move upwardly with portion 138 in an arcuate path about a pivot line 143 (FIG. 3). The instant invention is explained with respect to such a short travel of the pickup head 145 that error due to the above assumption is of no practical consequence to the invention.

Assembly 56 has an arm structure 146 which supports the head 145 for grasping a pickup probe 147 and connecting the same to an internal passageway (not shown) in head 145 to draw vacuum in probe 147. Probe 147 is inserted upwardly into head 145 and engaged therein by a set screw 148 so a small cylindrical portion and a tapered portion of probe 147 protrude downwardly toward web 20 and needle 135.

Portion 138 of assembly 56 is moved by two sources of power in the preferred embodiment of the invention. A linear stepping motor 152, in response to D.C. digital pulses, provides an upwardly movement in steps at line 153 during a short traverse by head 145 in removing a chip 15 from a web 20. Motor 152 pushes downwardly onto an assembly of levers (not shown) which convert downward movement into an upward movement of head 145 in steps of about one mil (0.0254 mm) each.

A second source of power rotates arm 138 by rotating a drive shaft assembly 154 including a resilient portion 155, a connector 156 and a short, rigid portion 158 which is journalled in the fixed portion 140 of assembly 56. Shaft 154 rotates arm 138 through a full 180 degree arc for a next operation such as for testing a chip 15 in the same head 145 and probe 147 used for pickup from web 20. In addition, shaft 154 may provide a yielding, biasing pressure upon head 145 which is believed to be novel for removing articles from adhesive webs.

Expedients for providing such a yielding bias upon head 145 are disclosed herein merely for disclosing a presently preferred mode of practicing the invention. Such disclosed expedients are believed to be a separate invention which is broadly applicable to operations other than removing articles from webs. Consequently, such separate invention is more fully described and claimed in an application entitled "Article Stability At And Transfer Between Stations" filed the same day and assigned to the same assignee as the present application. To the extent that additional information may be required herein, the application referred to is hereby incorporated and made a part hereof by this reference. To the extent that the application for the separate invention may not be readily available for reference, the pickup assembly 56 is more fully shown, and will be described herein with reference to, FIGS. 7-9.

Removing The Articles

FIGS. 5A-G are greatly enlarged, sectional views taken along line 5—5 in FIG. 3 to show features more clearly and teach successive steps in the removal process. The features which are the same or similar in all views will be discussed first.

Die 116 has peripheral surfaces 162 sloping away from a central surface 160 which contains the vacuum cavity 120 shown here and in FIG. 4. Web 20 has a first, adherent side seen holding a row of chips 15 on top and a second, relatively smooth side in conforming contact with die 116 and its surfaces 160 and 162.

A leading chip 15 in the row is targeted for removal and is located centrally of cavity 120. Also, a portion of web 20 located over central surface 160 is substantially restrained from movement by expected forces away from die 116 by sufficient vacuum drawn in cavity 120 according to arrows 164. As seen in FIG. 4, a vacuum source at fitting 118 draws through a passageway 113 and chamber 114 to cavity 120 to cause sufficient vacuum.

The needle-like member 135 is disposed within cavity 120 at the second side of the web 20. Such needle 135 is moved longitudinally of itself and perpendicularly of web 20 by action of motor 110 on shaft 125, pin 128 and rod 132 (all seen in FIG. 4). The target chip 15 lies in the path along which the needle 135 moves, and it will be seen that needle 135 pierces web 20 and engages such chip in its movement.

Opposite needle 135 the pickup probe 147 is located at the first side of web 20, including expedients for retaining an article 15 on the probe. For example, if magnetic articles 15 are to be retained, probe 147 may contain a magnet. However, for retaining chips 15, probe 147 is served by a vacuum system. FIG. 3 shows that a vacuum source applied according to arrow 165 at fitting 149 draws through tubes 150 and 151 to exhaust head 145. A passageway 166 in probe 147 connects to head 145 and completes vacuum communication to a pickup face 168 of probe 147 (FIGS. 5A-G).

Expedients are also provided for moving the probe 147 relative to and with the target chip 15 and the needle 135. Such expedients were explained briefly with respect to FIGS. 3 and 4 and will be more fully explained with respect to FIGS. 7-9. Furthermore, in a perceived departure from the prior art, expedients will be explained for synchronizing movement of needle 135 and probe 147 with a target article held between the needle and probe, at least until the chip 15 separates from web 20.

One of the problems in the prior art was that a pickup probe tended to disturb articles adjacent a target article. In an attempt to solve the problem, a central surface, sometimes called a plateau, was created to force only one target article out of the plane of a web to isolate the article on the plateau. Unfortunately, undesirable distortion of the web was experienced, and the technique was not applicable to very small articles. FIGS. 5A-G show that chips 15 are smaller than cavity 120 which is sized to accommodate needle 135. Consequently, expedients had to be found to accommodate more than one chip on a plateau in such a manner that a probe could pick up a target chip without disturbing adjacent chips.

A solution is to make the plateau wide enough to accommodate at least one additional chip with full support next to (or on any side of) the target chip. Accordingly, when a flat face 168 of a probe 147 contacts the target and adjacent chips 15, there is no perceived displacement of the adjacent chips.

It has also been found that there is a relationship between the web 20, the area of central surface 160 and the vacuum drawn in cavity 120, all of which may bear upon the removal process. For example, it is known that the web 20 sometimes instantaneously deflects away from die 116 (FIG. 5D) when needle 135 pierces the web. At such instant, the vacuum forces are distributed at the second side of web 20 over the full area normally touching surface 160. Therefore, the web 20 should be sufficiently strong to resist the forces of needle 135 and the vacuum applied over the area so web 20 does not deflect undesirably away from die 116. Undue deflection causes both distortion in the web material and displacement of adjacent chips.

The vacuum drawn in cavity 120 should also be sufficient to draw from the larger volume and the larger surface caused by the instantaneous deflection of web 20. It will further be seen that minimizing deflection of web 20 minimizes the distance the distance needle 135 must pierce the web to separate a target chip 15 from the web.

Figure 5A:
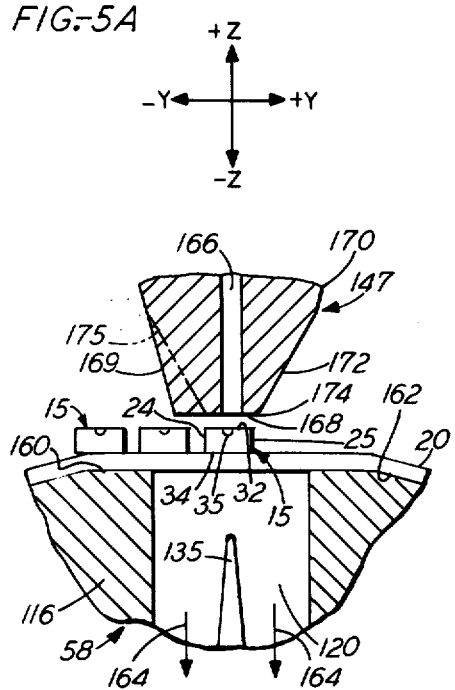
FIGS. 5A—G are greatly enlarged, sectional views taken along line 5—5 in FIG. 3, to show successive steps in removing chips according to the invention.

The dimensions of needle 135 bear upon the removal process and are selected with respect to the piercing distance and the spacing of the chips 15. The width of the needle 135 at the restrained, pierced web 20 should be insufficient to displace chips 15 adjacent the target chip. For example, in the illustrative embodiment, the needle 135 pierces web 20 and extends further by only about 15 mils (0.381 mm) after contacting the target chip 15. Needle 135 pushes portions of web material upward so not all of the 10 mil spacing is available for needle width (FIGS. 5E and F). It is found that the width of needle 135 at the fully pierced web (FIG. 5F) should be less than about one-half ($\frac{1}{2}$) the spacing of the chips 15 in the illustrative embodiment.

Probe 147 presents a substantially flat face 168 for contacting and registering with a target chip 15. Probe 147 has an inverted, frustoconical shape, and lines 169 and 170 (FIG. 5A) normally define the elements of the cone. However, a portion has been conveniently cut off a side of probe 147 to form a surface 172 facing an operator who sits in the +Y direction and looks in the −Y direction toward the side 25 of a chip 15. Such surface 172 intersects flat surface 168 to form a reference edge 174 which is conveniently disposed for comparison with a top edge of side 25 of a target chip 15. An operator then adjusts the Y indexer 50 until registration of the leading chip 15 in the row, i.e., the target chip, is achieved. It is incidentally seen that at least four reference edges may be utilized for registration along all four top edges of a chip 15. For example, a surface 175 (shown in phantom style) may be formed on an opposite side of probe 147 to form another reference edge to compare with an opposite top edge of a chip 15. Such comparisons may be made with magnification and similar optical aid including utilization of magnifying closed circuit television systems.

Figure 5B:
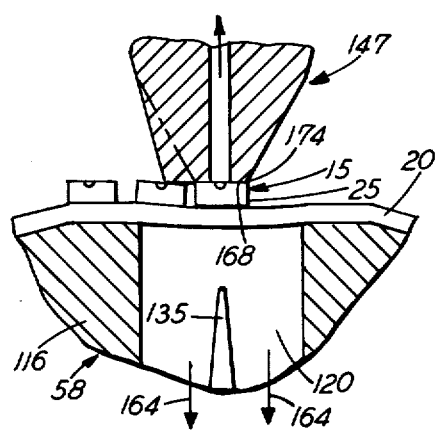

FIGS. 5B and C illustrate other advantageous steps in the practice of the invention as applied to microminiature devices like the chips 15. It is desirable to set the height of probe face 168 at about 1.5 mils (0.0381 mm) above top sides 32 of a row of chips 15 for searching and registration purposes. This close height tends to mitigate parallax problems in comparing reference edge 174 with the top leading edge of a target chip 15. However, such a precise height is often difficult to attain. For this and other reasons, the probe 147 is made movable in one mil increments by operating motor 152 (FIG. 3) with a toggle switch (not shown) in a momentary-contact, up or down mode. Note in FIG. 5B that probe 147 has been moved downward by two steps (2 mils) which has caused contact with a target chip 15 and slight (about 0.5 mil) downward deflection of web 20.

Such downward deflection of web 20 affords several advantages in setting and controlling probe 147, needle 135 and web 20. It has been found that the deflection is readily observed because it reflects light differently than the first, adhesive side of web 20 which is normally flat on surface 160. Accordingly, when finding the proper search height for face 168, the operator jogs the toggle switch to lower the probe 147 upon a chip 15 to deflect web 20 as seen in FIG. 5B. Then the operator merely jogs upward by two steps to obtain the search height.

Figure 5C:
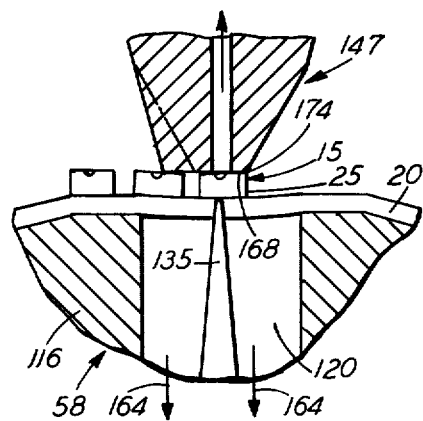

Such deflection procedure is utilized for setting the position of needle 135 when such needle is replaced due to a defective point, etc. With probe 147, a chip 15 and the web 20 in a lowered position (FIG. 5B), the needle is moved upwardly in 1 mil steps until it contacts the chip 15 as seen in FIG. 5C. The number of steps required is noted in memory for routine removal of chips thereafter until a new needle 135 is required.

Figure 5D:
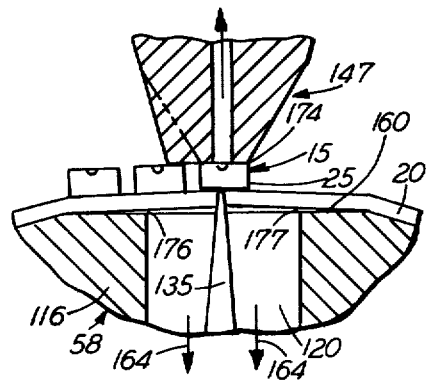
Figure 5E:
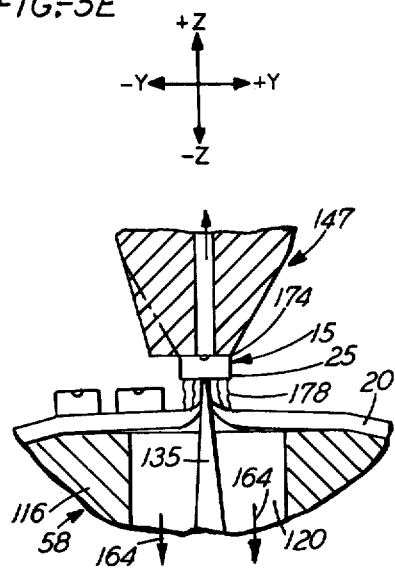
Figure 5F:
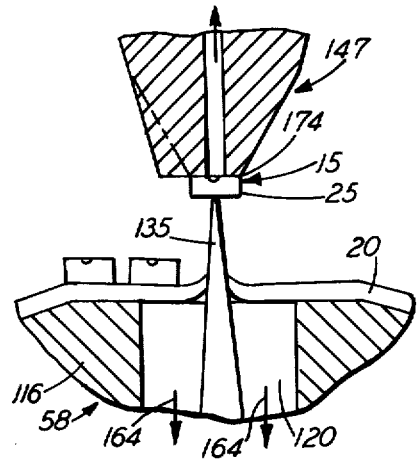

Deflecting web 20 slightly downward also seems to assist in restraining web 20 during a synchronized push-off step seen in FIG. 5D. It has been found that less deflection of web 20 away from die 116 occurs to cause lesser spaces 176 and 177 when the web has initially been deflected downwardly as shown in FIGS. 5B and C. It is theorized that such initial downward deflection enables the source drawing a vacuum in cavity 120 to obtain a capacitance advantage to at least partially offset the extra volume imposed by spaces 176 and 177.

From FIG. 5C through FIG. 5F it can be seen that the pickup probe 147, the target chip 15 and the needle 135 move in the same direction and are synchronized. In FIGS. 5A, B and G, the pickup probe 147 and needle 135 move relative to but not with each other.

It is believed that such synchronized movement during the important push-off steps is important for many reasons. Note in FIG. 5E that undesirable filaments of adhesive 178 tend to cling to a chip 15. Unfortunately, such filaments pull on a chip 15 in an unsymmetrical manner and tend to disorient the chip or otherwise frustrate proper pickup. Also, a controlled, resilient pressure may be lightly applied by probe 147 upon a chip 15 and needle 135 to stabilize the relative positions of each item at pickup without injury to a delicate chip 15. Apparatus for applying such controlled, resilient pressure will be described with respect to FIGS. 7-9. It is incidentally noted that windows 35 and 36 (only 35 shown) are safely opposite the point pressure of the needle 135 during pickup.

Figure 5G:
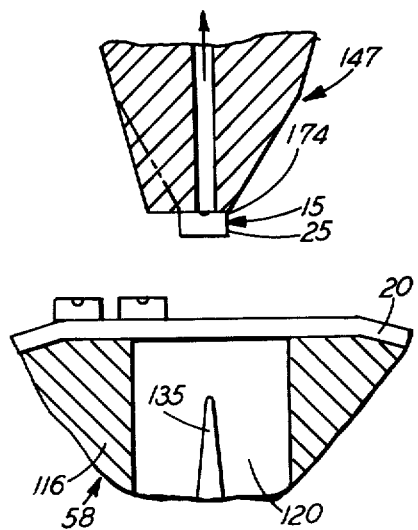

FIG. 5G shows the condition of web 20 when pickup is complete and needle 135 is withdrawn. The removed chip 15 is then transferred and web 20 is indexed in a +Y direction (and checked in the X direction) to pick up a next chip 15 in the row.

Certain properties of the sheet material for web 20 and apparatus for supporting and indexing the web are of interest. For example, the sheet material is preferably a transparent film so the needle 135 may be observed from above web 20. Also, the adhesive on the first side should pull cleanly away from an article 15 without leaving residue. The second side which contacts die 116 should be smooth and lubricative to facilitate indexing over surfaces 160 and 162. Also, the sheet should be strong enough to resist the vacuum in cavity 120 and be cleanly cut by needle 135 without leaving ragged edges to frustrate indexing. Preferably, the sheet should take the shape of die 116 without undue stretching. For example, the hoop 44 is lowered so web 20 is set only 62 mils (1.575 mm) below the central surface 160 to achieve the shape of web 20 illustrated in FIGS. 4 and 5A-G. Moreover, the sheet material should be substantially elastic, at least within the range of deformation seen in the indexing operation. For example, the shape of die surfaces 160 and 162 and the tautness with which web 20 is conformed thereto should be selected with respect to the elasticity of the sheet. Web 20 should timely recover its shape as the web is indexed to bring successive target articles over needle 135 and under pickup probe 147. A suitable material for web 20 in the illustrative embodiment is a polyvinyl base film having an acrylic adhesive film on the first side and a lubricative substance, such as is provided by a silicon treatment, on the second side. Such a sheet is manufactured by Nitto Denko America, Inc. of Lake Success, N.Y. and sold under its trade designation as "Mounting Tape SPV-224."

Figure 6:
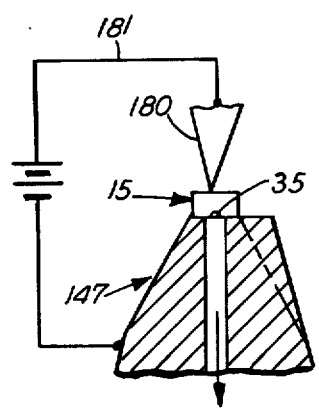
FIG. 6 is a sectional view of the pickup probe showing a testing operation which is enhanced by the practice of the invention.

FIG. 6 shows a next operation in processing laser chips 15 wherein it is seen that retaining the chips with the precise orientation on probe 147 is advantageous. A contactor 180 and a biasing circuit 181 provide current to generate light at windows 35 and 36 (only 35 is seen). Such windows are only about 4 microns wide by about 0.2 microns high and the windows should be carefully aligned to light detecting apparatus (not shown) without manual adjustment. Such alignment is conveniently facilitated by precise pickup according to the instant invention.

Pickup Assembly 56

Figure 7:
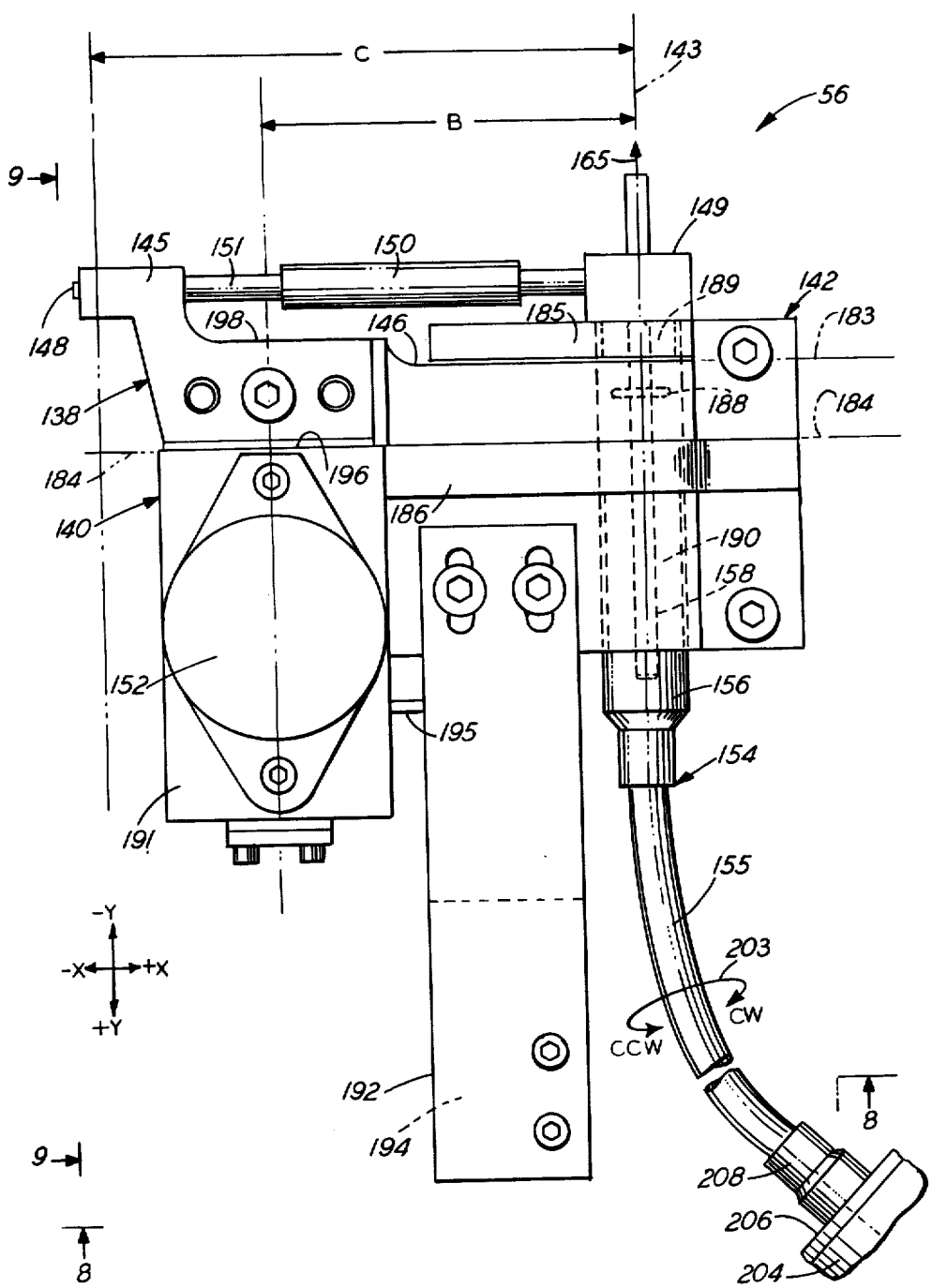
FIG. 7 is an enlarged plan view of the pickup assembly shown in FIGS. 3 and 4.
Figure 8:
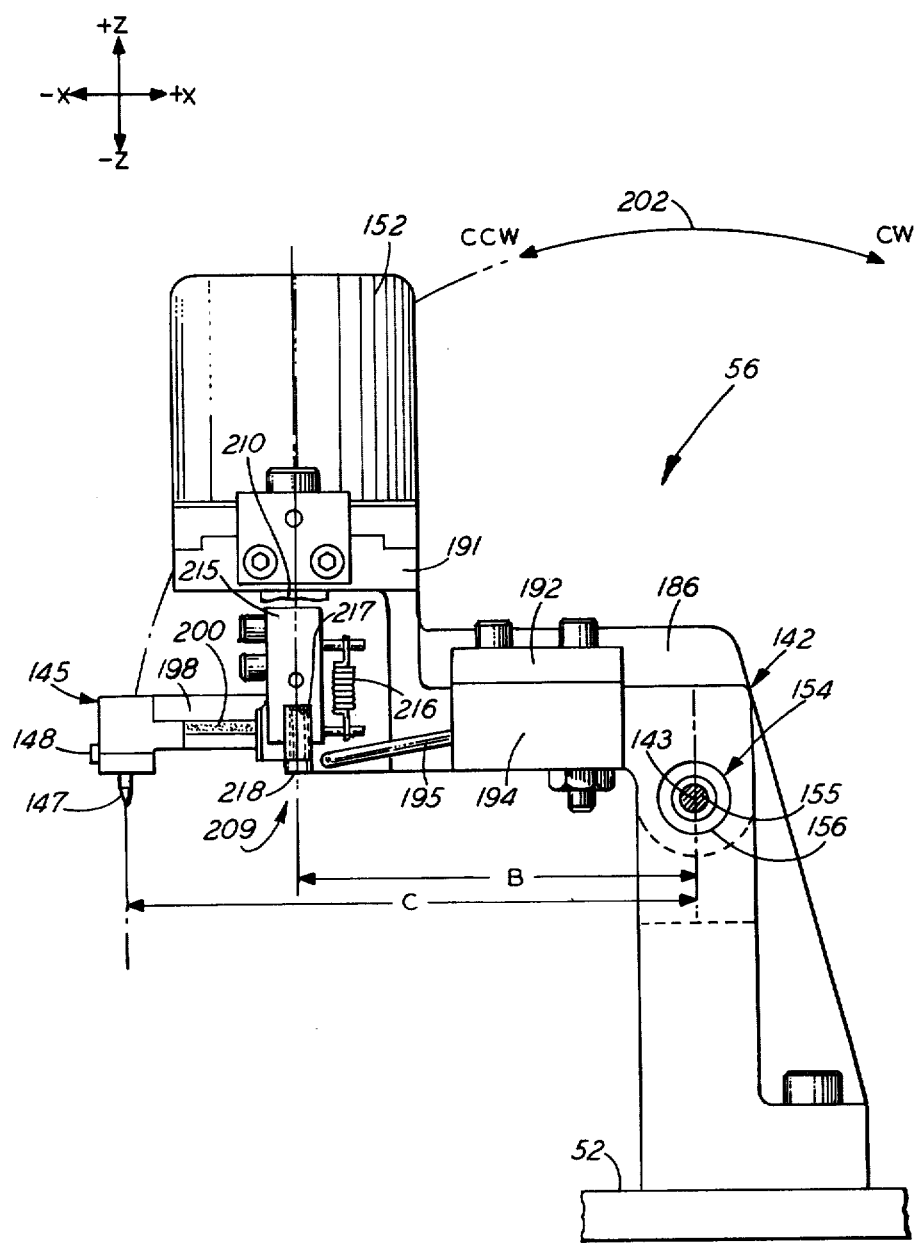
FIG. 8 is a front view of the pickup assembly shown in FIG. 7, taken along line 8—8.

FIGS. 7-9 illustrate assembly 56 in an enlarged manner to support supplemental discussion, particularly with regard to moving the pickup head 145 in steps and to resiliently bias such pickup head.

FIG. 7 is a plan view showing how the movable portion 138 separates from the fixed portion 140 along theoretical lines 183 and 184 when the movable portion is pivoted about line 143. FIGS. 8 and 9 are elevation views taken along line 8—8 and line 9—9, respectively, shown in FIG. 7. Assembly 56 is seen to be supported by a stand 142 which in turn is supported by movable plate 52 (FIG. 8 and 9). Stand 142 includes a guide wall 185 which is cantilevered in a —X direction and another guide wall 186 which also serves as a reinforcing member for stand 142. Between walls 185 and 186, there is an opening 187 (FIG. 9) to receive guided arm 146 which is fixed to short shaft 158 by a pin 188 (FIG. 7). Shaft 158 is journalled in stand 142 within bearing 189 (in wall 185) and bearing 190. Stand 142 also has a horizontal plate portion 191 to support the motor 152. Attached to stand 142 there is a plate 192 extending in the +Y direction to support a photocell 194. Cell 194 has a light guide 195 which is threaded through stand 142 to sense light reflection at point 196 at the separation line 184 (FIG. 7), below motor plate 191 and along wall 186.

Head 145 has an extension plate portion 198 for attaching to arm 146 and an insulative member 200 is inserted between plate 198 and arm 146 to electrically and thermally isolate head 145 (FIGS. 8 and 9). Vacuum tube 151 and fitting 149 (FIG. 7) also serve head 145 and are connected by an insulative hose 150 to further isolate head 145.

Head 145 of portion 138 is moved arcuately about pivot line 143 through a path defined by arrow 202 (FIG. 8) in a clockwise (CW) or counterclockwise (CCW) direction. Such movement is achieved by rotating shaft assembly 154 in a CW or CCW direction according to arrow 203 (FIG. 7) utilizing a motor 204 attached to a plate 206. Motor 204 is preferably a stepping motor having a given number of poles, e.g. 200 poles for one complete revolution.

In operation of motor 204, shaft assembly 154, arm 146 and head 145, one steps the motor a given number of steps to arcuately move head 145 through a given angle. For example, to move head 145 through a 180 degree angle, one feeds 100 pulses at a proper voltage to motor 204 by known means. Head 145 then moves a chip 15 attached to probe 147 a distance in the +X direction equal to two times C (FIGS. 7 and 8). Head 145 is then inverted and a chip 15 is in a test position represented by FIG. 6.

Motor 204, shaft assembly 154 and arm 146 perform another useful function during pickup of a chip 15 as described previously. Before pickup occurs and while head 145 is in the position shown in FIGS. 7-9, one can feed extra pulses to partially rotate resilient shaft 155 in a CCW direction. Alternatively, one can manually rotate a connector 208 in a CCW direction by an amount corresponding to the poles in motor 204. There is a perceived tug on fitting 208 as an internal portion (typically a rotor) of motor 204 is rotated over each pole. Note that short shaft 158 does not rotate because head 145 is fixed against apparatus in a manner to be explained. Therefore, only the portion of resilient shaft 155 which is close to connector 208 is fully rotated. From the connector 208 to the connector 156, each portion of shaft 155 rotates by a different amount in proportion to the torsional strength of the resilient material. The purpose of the extra rotation is achieved in the form of resilient biasing pressure of probe 147 against linkage which will now be explained.

It was previously noted in FIG. 4 that the push-off motor 110 steps the needle 135 vertically in 1 mil steps corresponding to each pulse received. However, it is not practical to use the same motor to move probe 147 up and down in the Z direction. The motor body is so large it would restrict an operator's field of view in observing the chips 15 and probe 147 under magnification. Also, such a motor cannot readily be applied directly to head 145 for mounting reasons. Accordingly, a smaller motor 152 is applied via a linkage assembly 209 (FIGS. 8 and 9) in an offset manner.

A suitable motor 152 is a linear stepping motor which translates its shaft 210 (FIG. 9) in successive steps, in response to successive 12 volt digital pulses. Such a motor is provided by North American Phillips Controls Corporation of Chesire, Conn. and sold under its trade designation as a "Digital Linear Actuator, K92121-P2." Motor 152 causes its shaft 210 to advance or retract about 2 mils (0.0508 mm) per pulse over a maximum distance of about 0.50 inch (12.7 mm). Shaft 210 is cut off for clarity in FIG. 8.

FIG. 9 shows shaft 210 in contact with a link 211 which pivots about a pin 212. Link has two reaction (pressure) points 213 and 214 which are spaced from pin 212 by distances E and F, respectively. A bracket 215 is mounted above link 211 to support a spring 216 which biases link 211 in an upwardly direction. Bracket 215 also has two legs which straddle link 211 (FIG. 8) and a seat 217 which bears against an adjustable stopping pin 218 threaded through link 211. In the illustrative embodiment, a downward movement of shaft 210 by one step moves link 211 upward at point 213 by E/F of a step or about 0.7 mil (0.0178 mm).

Pressure point 213 of link 212 bears against a rounded portion of the end of arm 146 as best seen in FIG. 9. FIGS. 7 and 8 show that the centerline of motor 152 which coincides with the pressure point 123 is spaced a distance B from the pivot line 143. Pickup head 145 and probe 147 are spaced from pivot line 143 by a distance C. According an upward movement at point 213 is magnified by the ratio C/B in moving probe 147 upwardly. In the illustrative embodiment, an upward step of about 0.7 mil at point 213 provides an upward movement of about 1 mil at probe 147.

In operation of the flexible shaft assembly 154 and the linkage assembly 208, one feeds about 100 pulses to motor 204 to move head 145 in a CCW direction from a station (not shown) to the position shown in FIGS. 7-9. Then resilient shaft 155 is rotated by moving connector 208 CCW by about three poles in motor 204. A resilient bias in a CCW direction is thereby imposed by arm 146 against linkage assembly 209. To lower pickup probe in 1 mil steps, one feeds a pulse having a proper voltage to motor 152 to retract shaft 210 about 1 mil and transmit about a 50% diminished movement of about 1 mil to probe 147. When probe 147 and push-off needle 135 are in the position shown in FIG. 5C, one feeds simultaneous digital pulses to push-off motor 110 (FIG. 4) and pickup motor 152 (FIGS. 7-9). Note that transferring and biasing motor 204 (FIG. 7) is inactive during pickup. After probe 147 and needle 135 have moved in synchronization (with a chip 15 therebetween) by about 15 steps, removal has been achieved. During such removal the torsion in resilient shaft 155 gets slightly, progressively greater. After removal the motor 204 is fed about 103 pulses to relieve the torsional bias and to transfer the chip CW through a 180 degree arc according to arrow 202 (FIG. 8), to a next operation.

Alternate Embodiments And Considerations

It will be appreciated that the illustrative embodiment includes many features which are presently preferred, although not essential, to the invention. For example, the removal of a row of laser chips is described whereas the chips need not be disposed in a row and they need not be laser chips.

Also, the operation of the push-off motor 110, the pickup motor 152 and the transfer (and biasing) motor 204 has been described with respect to digital pulses and steps. Of course, timed analog signals could as well be utilized with conventional controls. However, the utilization of digital pulses provides good stepping of the removal apparatus and is amenable to more advantageous controls. For example, it is preferred to exploit the greater speed and versatility of a programmable, general purpose microprocessor. An EPROM Microcomputer sold by Intel Corporation of Santa Clara, Calif. as its Model No. 8748 is suitable for controlling the removal apparatus as part of a larger machine.

In general operation of the removal process, one first installs a hoop 44 and orients a row of chips 15 thereon to follow the ±Y direction as previously explained for FIG. 3. A leading chip 15 is registered and the search elevation of probe 147 is established by deflecting web 20 and raising the probe by two steps. When a new needle is installed, the number of steps to move needle 135 from a rest position to a target chip is stored in memory along with the number of steps for probe 147 and needle 135 to move in unison to remove a chip 15 from web 20. Accordingly, an operator manipulates the Y indexer 50 to achieve registration by comparing reference edge 174 of probe 147 with the top edge of side 25 of a leading chip 15. Then a switch is activated to achieve microprocessor control of the ensuing pickup operation of a chip 15.

FIG. 10 shows an abbreviated program in the form of a flow chart entitled "Subroutine (S/R) Remove Chip From Web." Standard programming techniques may be further employed to reduce the flow chart to equivalent machine language in a known manner. Also, it will be recognized that only the process-oriented portion is shown without such items as machine control which are not needed to understand the invention.

The S/R starts at a circuit terminal represented by a flat oval 220. Assuming photocell 194 (FIGS. 7-9) senses that arm 146 is in place, the program may be instituted. Motor 152 retracts shaft 210 to lower the pickup probe (PUP) by two steps deflecting a chip 15 and web 20 downward according to process block (PB) 222. The vacuum to cavity 120 is activated and the number of steps to advance push-off needle (PON) 135 from a rest position to the chip 15 is obtained from memory according to PB 224. The PON 135 is raised a step at each pulse according to PB 226 and a data field is continually scanned according to decision block (DB) 228 to determine when contact to chip 15 is achieved. Then the vacuum to PUP 147 (as seen by arrow 165 in FIG. 7) is actuated and the number of steps to move motor 110 and 152 in unison is obtained from memory according to PB 230. In synchronization, motors 110 and 152 are pulsed to raise PUP 147 and PON 135 (with a chip 15) one step at each pulse according to PB 232. A data field is continually scanned according to DB 234 to determine when pickup is complete. Then PON 135 is lowered to its rest position according to PB 236 and the web 20 elastically retracts around a hole made by PON 135 during push off. Power is then switched to motor 204 so it may be pulsed for inverting and transferring the PUP 147 (with chips 15) to a next operation according to PB 238 and manual control (or more conventional control) takes over from terminal 240.

There have been illustrated herein certain practical embodiments and applications of the invention. It is believed that one of ordinary skill in this art can, with little experimentation, adapt the teachings so other articles may be removed from adhesive webs. Such adaptations and refinements may be made without departing from the spirit and scope of the present invention.

What is claimed is:

1. Apparatus for removing ones from an array of articles on an adhesive web, comprising:
    a forming die having a planar, central surface containing a vacuum cavity and peripheral surfaces sloping away from said central surface;
    a web having a first, adherent side for holding the articles and a second side for contacting the die, including means for conforming the web to said die surfaces such that an article targeted for removal is located centrally of the cavity on a planar, pickup portion of the web, said portion being substantially restrained from movement by expected forces away from the die by sufficient vacuum drawn in the cavity;
    a needle-like member disposed within the cavity at the second side of the web, and means for moving said needle longitudinally of itself in a first direction perpendicularly of and through the web along a path containing the target article and in a second, opposite direction to a rest position;
    a pickup probe disposed at the first side of the web opposite the needle, including means for retaining an article on the probe and means for moving the probe in the second direction taken by the needle, into contact with the target article, and in the first, opposite direction with the target article and the needle; and
    means for synchronizing the respective means for moving the needle and probe together in the first direction with the target article held therebetween at least until said article separates from the web.

2. Apparatus as in claim 1 wherein the forming die, web and needle further comprise:
    the die having a central surface of a width to hold at least one article adjacent a target article in a common plane on the web, said adjacent article remaining laterally in place on the web during probe contact and pickup of the target article;
    the web being sufficiently strong and the portion over the central surface being restrained by sufficient vacuum drawn thereunder during pickup that said web portion is prevented from undesirable deflection away from the die such that the needle pierces the web for a minimal distance sufficient to separate the target article from the web; and
    the dimensions of the needle being selected with respect to the piercing distance and a spacing of the articles such that the width of the needle at the restrained, pierced web is insufficient to displace articles adjacent the target article.

3. Apparatus as in claim 1 wherein the pickup probe further comprises:
    a substantially flat surface for contacting an article; and
    at least one reference edge formed by intersecting said flat surface and a side surface, said edge disposed for comparison with an edge of a target article such that a desired registration of the probe with said article may be readily ascertained.

4. Apparatus as in claim 2 wherein the means for moving the probe further comprises:
    means to force the probe and a target article against the web to deflect the web toward the cavity and reflect light from the first, adherent side of the web such that restraint of the web is enhanced and positive contact of probe to target article is readily ascertained.

5. Apparatus as in claim 1 wherein the web is adapted to be initially, manually contacted to, and made to conform with, the die to achieve alignment and orientation of the array of chips with respect to the pickup probe and needle, further comprising:

means to index the web over and in conforming contact with the die in mutually perpendicular X and Y directions along a common plane.

6. Apparatus as in claim 5 wherein the web is made of a substantially elastic material, further comprising:
the shape of the die and the tautness with which the web is conformed thereto being selected with respect to the elastic properties of the web such that the web timely recovers its shape as said web is indexed to bring successive target articles over the needle and under the pickup probe.

7. A method of removing ones from an array of articles on an adhesive web, comprising:
supporting a forming die having a planar, central surface containing a vacuum cavity and peripheral surfaces sloping away from said central surface;
holding the articles on aweb having a first, adherent side and a second side for contacting the die, including conforming the web to said die surfaces such that an article targeted for removal is located centrally of the cavity on a planar pickup portion of the web, said portion being substantially restrained from movement by expected forces away from the die by sufficient vacuum drawn in the cavity;
disposing a needle-like member within the cavity at the second side of the web, and moving the needle longitudinally of itself in a first direction perpendicularly of and through the web along a path containing the target article to push said article off the web and in a second, opposite direction to a rest position;
disposing a pickup probe at the first side of the web opposite the needle, and moving the prbbe in the second direction taken by the needle, into contact with the target article, and then moving in the first, opposite direction with the target article and the needle, including retaining an article on the probe when in contact therewith; and
moving the needle and probe together in the first direction with the target article held therebetween at least until said article separates from the web.

8. A method as in claim 7 wherein the steps of supporting the forming die, holding articles on the web and disposing the needle further comprise:
supporting a die having a central surface of a width to hold at least one article adjacent a target article in a common plane on the web, said adjacent article remaining laterally in place on the web during probe contact and pickup of the target article;
holding the articles on a web having sufficient strength and the portion over the central surface being restrained by sufficient vacuum drawn thereunder during pickup that said web portion is prevented from undesirable deflection away from the die such that the needle pierces the web for a minimal distance sufficient to separate the target article from the web; and
disposing a needle having dimensions selected with respect to the piercing distance and a spacing of the articles such that the width of the needle at the restrained, pierced web is insufficient to displace articles adjacent the target article.

9. A method as in claim 7 wherein disposing the pickup probe further comprises:
disposing a substantially flat surface of the probe facing an article for contacting the article; and
forming at least one reference edge by intersecting said flat surface with a side surface and aligning said edge for comparison with an edge of a target article such that a desired registration of the probe with said article is readily ascertained.

10. A method as in claim 8 wherein moving the probe further comprises:
forcing the probe and a target article against the web to deflect the web toward the cavity and reflect light from the first, adherent side such that restraint of the web is enhanced and positive contact of probe to target article is readily ascertained.

11. A method as in claim 7 wherein the web is initially, manually contacted to, and made to conform with, the die to achieve alignment and orientation of the array of chips with respect to the pickup probe and needle, further comprising:
indexing the web over and in conforming contact with the die in mutually perpendicular X and Y directions along a common plane.

12. A method as in claim 11 wherein the web is made of a substantially elastic material, further comprising:
contacting the web to the shape of the die with a tautness relating to the elastic properties of the web such that the web timely recovers its shape as said web is indexed to bring successive target articles over the needle and under the pickup probe.

13. A method as in claim 7 wherein moving the probe and moving the needle are at least partially computer controlled, further comprising:
moving the pickup probe a given number of incremental downward steps to contact an article;
activating vacuum in the cavity and moving the push-off needle in incremental upward steps according to a prepared memory until contact is made to the article;
activating vacuum in the probe and, in synchronization, moving the pickup probe and the push-off needle with the article held therebetween in similar, incremental upward steps according to a prepared memory until the article is separated from the web; and
retracting the push-off needle to a rest position.

* * * * *